United States Patent [19]

Takeuchi

[11] 4,360,266

[45] Nov. 23, 1982

[54] CONTACT PRINTING METHOD AND APPARATUS

[75] Inventor: Satoshi Takeuchi, Kawasaki, Japan

[73] Assignee: Dai Nippon Insatsu Kabushiki Kaisha, Tokyo, Japan

[21] Appl. No.: 179,517

[22] Filed: Aug. 19, 1980

[30] Foreign Application Priority Data

Aug. 24, 1979 [JP] Japan .................................. 54-107957
Aug. 24, 1979 [JP] Japan .................................. 54-107958
Nov. 10, 1979 [JP] Japan .................................. 54-145934
May 23, 1980 [JP] Japan .................................. 55-68505

[51] Int. Cl.³ ........................ G03B 27/20; G03B 27/02
[52] U.S. Cl. ........................................ 355/91; 355/132
[58] Field of Search ..................... 355/87, 91, 94, 73, 355/132; 248/362, 363

[56] References Cited

U.S. PATENT DOCUMENTS

| 3,995,955 | 12/1976 | Töpfer | 355/91 |
| 4,007,987 | 2/1977 | Sheets | 355/91 |
| 4,054,383 | 10/1977 | Lin et al. | 355/91 |
| 4,089,603 | 5/1978 | Jacobs | 355/91 X |

Primary Examiner—Richard A. Wintercorn
Attorney, Agent, or Firm—Koda and Androlia

[57] ABSTRACT

For contact-printing an original such as a photographic negative on a light-sensitive material a vacuum printing frame is provided which comprises a first vacuum chamber between a light-transmitting plate and an elastic diaphragm, and a second vacuum chamber opposed to the first vacuum chamber across the diaphragm. The two vacuum chambers are evacuated simultaneously, with the original and sensitive material mounted in superposition in the first vacuum chamber. Upon subsequent introduction of atmospheric pressure into the second vacuum chamber the original and the sensitive material make close, uniform contact with each other, thereby making themselves ready for exposure. Another embodiment employs a third vacuum chamber disposed opposite to the first vacuum chamber across the light-transmitting plate. Evacuated simultaneously with the first and second vacuum chambers, the third vacuum chamber makes possible the use of a thinner light-transmitting plate, which normally is of glass. The invention is also disclosed as adapted for continuous printing operation.

9 Claims, 11 Drawing Figures

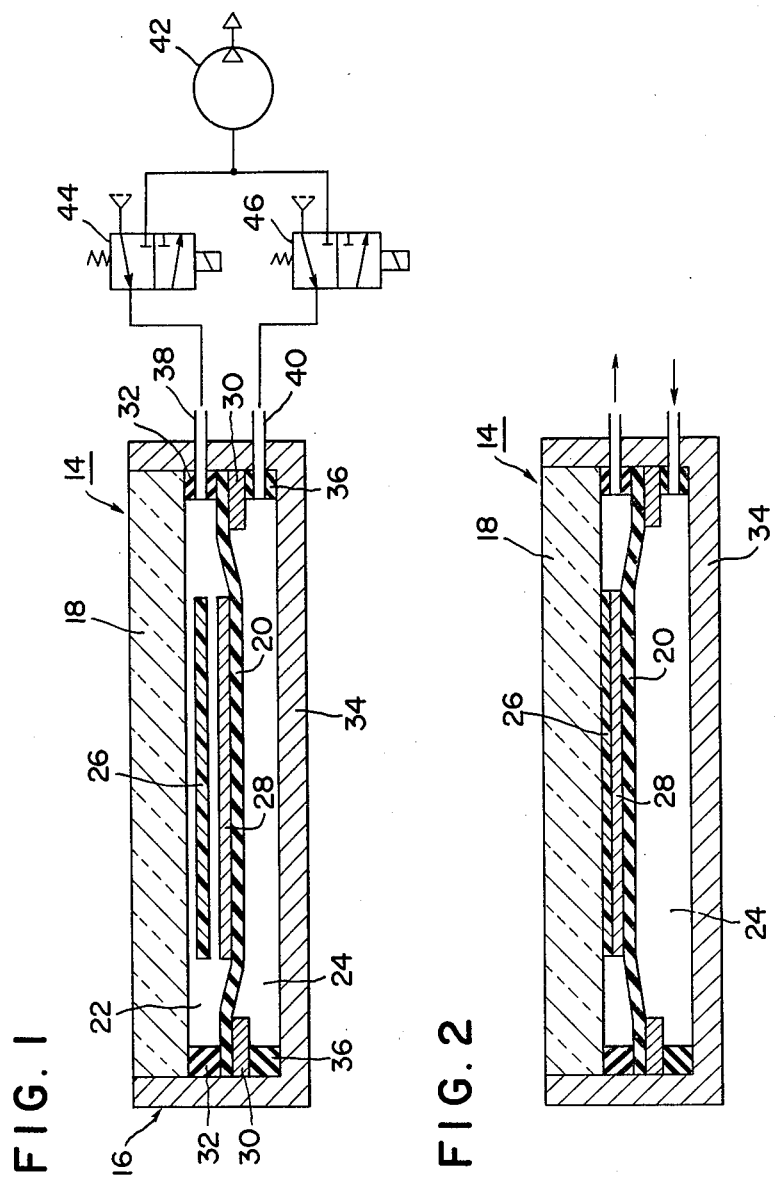

CONTACT PRINTING METHOD AND APPARATUS

BACKGROUND OF THE INVENTION

This invention relates to the contact printing of an original, such as a photographic negative, on a light-sensitive material by exposure. The invention deals more specifically with an improved contact printing method and apparatus employing vacuum to hold the original and the light-sensitive material in good contact with one another during exposure.

The vacuum contact printing method had gained extensive acceptance for accurate reproduction of the original image in photoduplication and the photographic preparation of printing plates, among other applications. This known method employs what is known as a vacuum printing frame, having a vacuum chamber between a rigid, light-transmitting plate, normally a pane of glass, and an elastic diaphragm of rubber or like material. The vacuum chamber houses an original (e.g., a photographic negative) and a light-sensitive material (e.g., a sensitive film or presensitized (PS) plate) in superposition. Upon pumping the vacuum chamber to a desired degree of vacuum, the difference between this vacuum and the atmospheric pressure acts on the diaphragm, causing the same to press the superposed original and light-sensitive material against the glass pane. Thus brought into contact with each other, the original and the light-sensitive material are then exposed through the glass pane.

This vacuum printing method, however, works well only in cases where either the original or the light-sensitive material is of paper, cloth, or like substances permeable to air. A problem arises when both are of nonpermeable substances. For example, if the light-sensitive material is a large, smooth-surfaced photographic film or PS plate for printing, and if the original is a similarly large film, then in the conventional vacuum printing frame air pockets will be readily produced between the original and the light-sensitive material and between the original and the glass pane. Such air pockets, particularly pronounced at the central regions of the superposed members, are readily recognizable from interference fringes known as Newton's rings.

The reason for the production of such air pockets is that upon evacuation of the vacuum chamber, the original and the light-sensitive materal have their peripheral portions first urged into close contact with the adjacent surfaces, thereby entrapping air between themselves and the adjacent surfaces. The removal of the entrapped air necessitates the evacuation of the vacuum chamber to a greater degree, until finally the air is forced out of the edges of the contacting members. An evacuation time as long as several minutes, or even several tens of minutes, has been common for the establishment of uniform contact between nonpermeable, flat-surfaced materials.

A conventional measure taken to circumvent this problem has been to roughen the contact surfaces of the original and the light-sensitive material to such a degree as to give no adverse effect on exposure. When brought into contact with each other, the roughened contact surfacs create a multitude of minute space therebetween, permitting ready withdrawal of air that might otherwise be confined between the contact surfaces. This known measure makes possible the establishment of uniform contact between the original and the light-sensitive material twice or even several times as fast as in the case where they are smooth-surfaced, although the evacuation time depends greatly upon the degree of roughening of the contact surfaces. As far as the applicant is aware, this has so far been just about the only method of obtaining good contact in a comparatively short time.

SUMMARY OF THE INVENTION

The present invention aims at the provision of an improved method of, and apparatus for, contact-printing the image of the original on the light-sensitive material without the noted difficulties of the prior art. The invention succeeds in drastic curtailment of the evacuation time heretofore required for urging the original and the light-sensitive material into absolute contact with one another, without the need for roughening their contact surfaces. It also solves the problem of how to reduce the pressure difference acting on the light-transmitting plate on evacuation.

Stated in brief, the invention proposes the use of a vacuum printing frame which has, in addition to the usual vacuum chamber between a light-transmitting plate and an elastic diaphragm, a second vacuum chamber disposed on the side of the elastic diaphragm opposite to the first vacuum chamber. The first and the second vacuum chambers are evacuated simultaneously, with an original and a light-sensitive material placed in superposition in the first vacuum chamber. Upon subsequent introduction of atmospheric air into the second vacuum chamber the diaphragm presses the original and the light-sensitive material against the light-transmitting plate owing to the vacuum in the first vacuum chamber and so establishes close, uniform contact therebetween. There is absolutely no possibility of the creation of air pockets between the contacting members because the first vacuum chamber has been exhausted before they are forced into contact with one another.

Another preferred form of the vacuum printing frame according to this invention incorporates a third vacuum chamber disposed opposite to the first vacuum chamber across the light-transmitting plate. Evacuated simultaneously with the first and second vacuum chambers, the third vacuum chamber functions to prevent the exertion of any atmospheric pressure on the light-transmitting plate. Consequently the light-transmitting plate can be of approximately the same strength as that of the prior art printing frame.

The provision of the third vacuum chamber also mades it possible to employ an elastic light-transmitting plate, such as transparent film, in combination with the elastic diaphragm. Such an elastic light-transmitting plate is suitable for use in printing frames for the production of extremely large prints.

The method and apparatus according to the invention are further adaptable for continuous printing operation, as also disclosed herein, without losing any of the advantages set forth above.

The above and other features and advantages of this invention and the manner of attaining them will become more apparent, and the invention itself will best be understood, from the following detailed description taken in connection with the attached drawings.

BRIEF DESCRIPTION OF THE DRAWINGS

FIG. 1 is a vertical sectional view of a first preferred form of the vacuum printing frame constructed in accordance with this invention, the printing frame being shown in a state before evacuation of its vacuum chambers;

FIG. 2 is a view similar to FIG. 1 except that the second vacuum chamber of the printing frame is shown filled with atmospheric air following the evacuation of both first and second vacuum chambers;

DETAILED DESCRIPTION

Figures 3, 4:
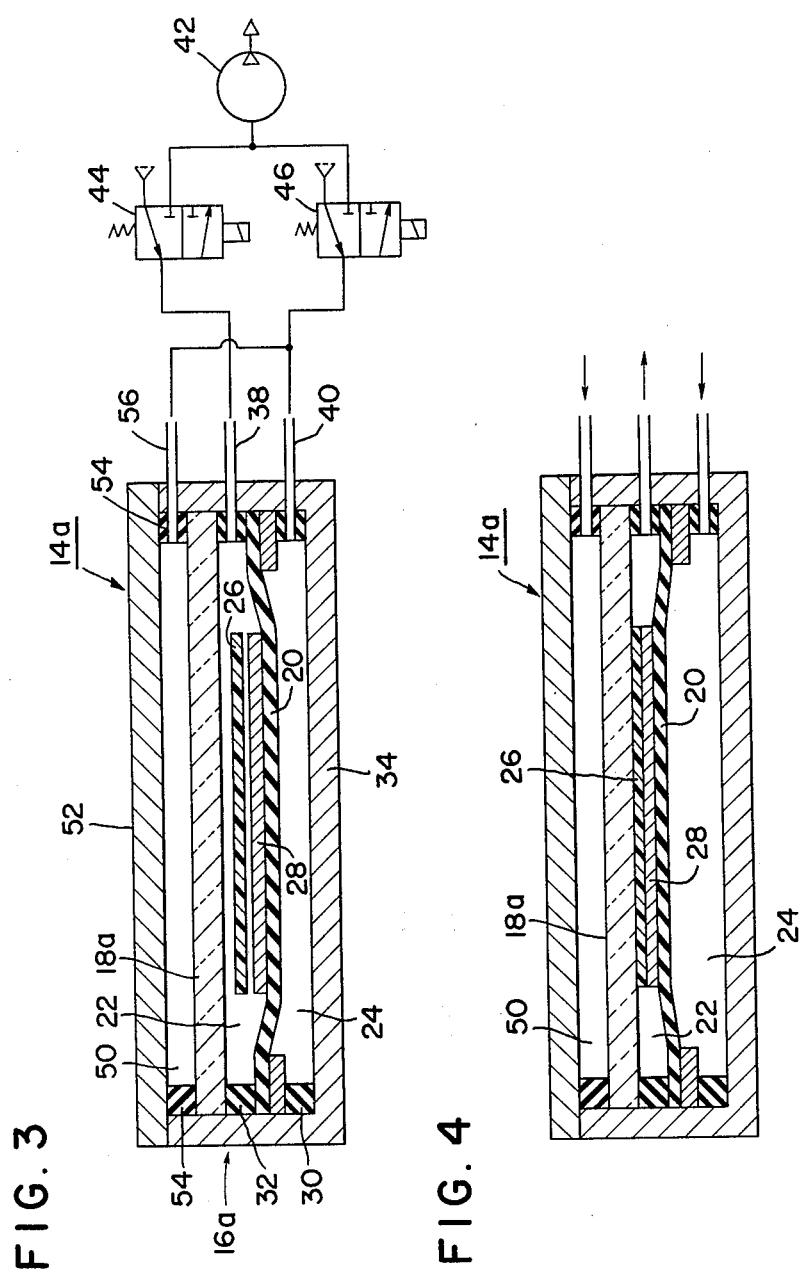
FIGS. 3, 4 and 5 are a series of vertical sectional views showing the sequential steps of operation of another preferred form of the vacuum printing frame according to the invention.

FIGS. 1 and 2 show the vacuum printing frame of this invention in its simplest configuration, for use in the practice of the inventive method. Given immediately hereafter is a description of this vacuum printing frame, followed by a discussion of the contact printing method in conjunction with the printing frame.

Generally designated 14, the illustrated vacuum printing frame broadly comprises: (1) a box-like, open-top casing 16; (2) a rigid, light-transmitting plate 18 removably but hermetically closing the open top of the casing 16; and (3) an elastic diaphragm 20 mounted within the casing 16 so as to partition its interior into an upper, first vacuum chamber 22 and a lower, second vacuum chamber 24. The first vacuum chamber 22 accommodates an original 26 and a light-sensitive material 28 in superposition, which are to be pneumatically urged into close, uniform contact with each other for printing the image of the original on the sensitive material by exposure.

The light-transmitting plate 18 must be rigid in this particular printing frame 14 and can normally be of glass, so that the plate 18 will hereinafter be referred to as the glass pane. Also, in this particular printing frame 14, the glass pane 18 must be of greater strength and rigidity than those in the conventional printing frames. For, in the use of the printing frame 14, the first and second vacuum chambers 22 and 24 are to be evacuated simultaneously, with the consequent exertion on the glass pane 18 of the difference between atmospheric pressure and the sum of the degrees of vacuum in the two vacuum chambers. The glass pane 18 would therefore shatter if insufficient in strength, and would buckle inwardly if lacking in rigidity. Thus a relatively thick acrylic-resin plate, for instance, can find use only on small-sized printing frames; on any large printing frame, it would buckle easily.

As has been pointed out, the prior art printing frame has only one vacuum chamber corresponding to the first vacuum chamber 22 of the present invention. On evacuation of the single vacuum chamber in the known printing frame the elastic diaphragm adheres to the glass pane via the original and sensitive material sandwiched therebetween. The glass pane has therefore been subject to comparatively low pressure differential. In the case of a one-by-one-meter glass pane, for instance, a thickness of 5 to 10 millimeters (mm) has been sufficient to provide the strength and rigidity for withstanding such low pressure differential.

By contrast, in the printing frame 14 of this invention, the glass pane 18 receives nearly the full atmospheric pressure when the two vacuum chambers 22 and 24 attain a high degree of vacuum. The pressure acting on the glass pane 18 will amount to as much as about ten tons if its size is one by one meter. In view of this the glass pane 18 should preferably be of reinforced or of laminated, bonded construction, with a thickness of at least about 30 mm.

The diaphragm 20 can be of rubber or like elastic material, as in the prior art. Ledges 30 on the inside surfaces of the casing 16 support the elastic diaphragm 20 in position. A packing 32, as of rubber, serves to hermetically seal the first vacuum chamber 22 between the glass pane 18 and the elastic diaphragm 20. Another similar packing 36 serves to airtightly seal the second vacuum chamber 24 between the elastic diaphragm 20 and the bottom 34 of the casing 16.

The first and second vacuum chambers 22 and 24 have suction ports 38 and 40, respectively, for communication with a vacuum pump 42 via respective valves 44 and 46. The valve 44 acts to selectively communicate the first vacuum chamber 22 with the vacuum pump 42 and with the atmosphere. The other valve 46 likewise acts to selectively communicate the second vacuum chamber 24 with the vacuum pump 42 and with the atmosphere. Although the drawings show the suction ports 38 and 40 as extending through the packings 32 and 36, it is understood that the suction ports could be formed elsewhere.

The casing 16 must also withstand a high pressure differential in the use of this printing frame 14. One recommended material for this casing, therefore, is steel with a thickness of approximately 10 mm. The use of thinner sheet steel is possible, however, provided that the casing is reinforced with angle braces or the like. Besides forming the second vacuum chamber 24, the casing 16 with its bottom 34 serves the additional purpose of protecting the elastic diaphragm 20 from damage due to external forces.

The following is a description of the contact printing method in accordance with this invention, with the use of the vacuum printing frame 14 of FIGS. 1 and 2. The original 26 and the light-sensitive material 28 are first placed in superposition in the first vacuum chamber 22, with the light-sensitive material mounted directly over the elastic diaphragm 20 and with the original disposed immediately under the glass pane 18. Then the valves 44 and 46 are actuated simultaneously to evacuate the first and second vacuum chambers 22 and 24 with the vacuum pump 42. Then, with the valve 46 actuated, only the second vacuum chamber 24 is caused to admit atmospheric pressure, with the result that the original 26 and sensitive material 28 are forced into close contact with each other by being pressed against the glass pane 18 by the elastic diaphragm 20, as shown in FIG. 2.

Next comes the step of exposing the sensitive material 28 to light through the original 26 and glass pane 18. Then, with the valve 44 actuated, atmospheric air is introduced into the first vacuum chamber 22 to take the printed material 28 out of the printing frame 14. Thereafter the printed material 28 may be developed in the usual manner.

By way of a practical example of the inventive method a "lith" type film of 24 by 30 inches (in.) was used as the original 26, and a PS (pre-sensitized) plate of full A size, without any surface roughening treatment, was used as the light-sensitive material 28. The printing frame 14 attained a uniform, close contact between the "lith" type film and the PS plate as its two vacuum chambers 22 and 24 were evacuated for 30 to 60 seconds, with the subsequent introduction of atmospheric pressure into the second chamber 24. This evacuation time is remarkably short compared with the prior art which required 5 to 15 minutes for providing uniform contact between members of like size and characters. The image printed and developed on the PS plate in accordance with the invention was of highly favorable quality.

The reason why the invention enables the establishment of absolute contact between original 26 and sensitive material 28 so efficiently may be explained as follows. Regardless of their size and flatness, these sheet-like members 26 and 28 do not make close contact with each other when they are merely placed one over the other atmospheric pressure, having much unoccupied spaces therebetween. The same holds true even under reduced pressure. The unoccupied spaces persist even if the ambient pressure of the two sheet-like members, placed one over the other under atmospheric pressure, is gradually reduced. Since the two members are in loose super-position, however, the pressure in the unfilled spaces therebetween responds immediately to the reduction of the ambient pressure. If the ambient pressure is 760 millimeters of mercury (mmHg), for example, then the pressure in the unfilled spaces will also be 760 mmHg.

The method of this invention dictates the simultaneous evacuation of the first and second vacuum chambers 22 and 24. The elastic diaphragm 20 exerts no pressure on the sheet-like members 26 and 28 during such simultaneous evacuation of the two chambers. Only upon subsequent introduction of atmospheric pressure into the second vacuum chamber 24 does the elastic diaphragm 20 press the members 26 and 28 against the glass pane 18. By this time the unoccupied spaces between the members 26 and 28 have been evacuated to the same extent as the rest of the first vacuum chamber 22, as has been discussed above. Thus the members 26 and 28 make uniform, close contact with each other, without any air pockets therebetween, when pressed against the glass pane 18 by the elastic diaphragm 20.

The length of time required for urging the members 26 and 28 into good contact with each other in accordance with the invention depends upon the exhausting ability of the vacuum pump 42 in use and on the capacities of the first and second vacuum chambers 22 and 24. The use of a higher-capacity vacuum pump, therefore, will lead to the curtailment of the time for evacuating the vacuum chambers 22 and 24 of given capacities to a desired degree.

The conventional belief has been that, the higher the degree of vacuum, the closer is the contact between the members 26 and 28. Based on this belief, efforts have been made to make the ambient pressure of the members 26 and 28 as close as possible to 760 mmHg vacuum. Air pockets do not disappear from between the members in accordance with the prior art, however, no matter how much the degree of vacuum is increased.

Experiment has proved that in printing the original image on the noted full-A-size PS plate in accordance with the present invention, faithful image reproduction is possible without necessarily evacuating the vacuum chambers 22 and 24 to 760 mmHg vacuum. As has also been ascertained experimentally, a vacuum of 650 to 700 mmHg normally suffices for halftone plates of 200 lines per in.; a vacuum of 600 to 650 mmHg for those of 150 lines per in.; and a vacuum of about 500 mmHg for those of 133 lines per in.

Thus the complete, or nearly complete, evacuation of the vacuum chambers 22 and 24 is not an absolute requirement for the establishment of uniform contact between the members 26 and 28. In the practice of this invention, therefore, the vacuum chambers may be exhausted to appropriate degrees depending upon the type of the original in use, in order to expedite the printing operation.

Figure 5:
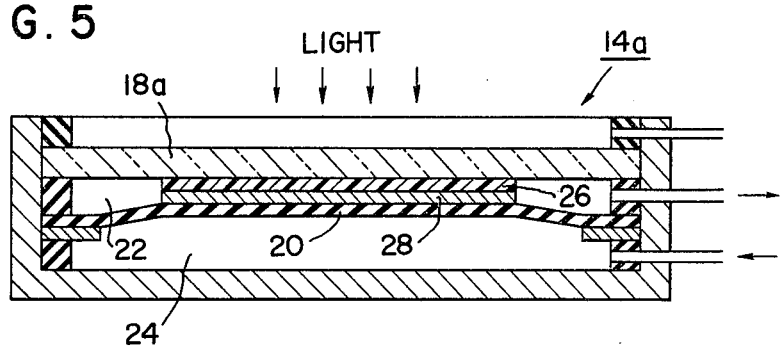

FIGS. 3, 4 and 5 illustrate a modified vacuum printing frame 14a and the sequential steps of its operation in accordance with the method of this invention. The modified printing frame 14a additionally incorporates a third vacuum chamber 50 lying opposite to the first vacuum chamber 22 across a rigid, light-transmitting plate 18a. This light-transmitting plate can also take the form of a pane of glass, but is thinner than the glass pane 18 of the printing frame 14 owing to the presence of the third vacuum chamber 50, as will become better understood as the description proceeds.

In order to define the third vacuum chamber 50 the printing frame 14a has a slightly modified casing 16a, with its top edges projecting upwardly beyond the glass pane 18a. A removable top cover 52 closes the open top of the casing 16a to bound the third vacuum chamber 50 bdtween itself and the glass pane 18a. Being subjected to the pressure differential between the atmosphere and the vacuum created in the third vacuum chamber 50, the top cover 52 should also be fabricated from sheet or like material of sufficient strength and rigidity.

A packing 54 hermetically seals the third vacuum chamber 50. This chamber also has its own suction port 56 for communicating with the vacuum pump 42 and with the atmosphere via the same valve 46 as the second vacuum chamber 24. The other details of construction can be identical with those set forth in connection with the printing frame 14 of FIGS. 1 and 2.

In the use of this printing frame 14a, and in accordance with the method of this invention, the original 26 and the light-sensitive material 28 are first placed in superposition on the elastic diaphragm 20 by removing the glass pane 18a and top cover 52 from the casing 16a. The leading of the original 26 and sensitive material 28 in the first vacuum chamber 22 is completed as the glass pane 18a and top cover 52 are subsequently mounted in positions on the casing 16a.

The next step is the simultaneous evacuation of the first 22, second 24 and third 50 vacuum chambers, by placing them in communication with the vacuum pump 42 via the valves 44 and 46. Then only the valve 46 is returned to its normal position thereby blocking communication of the second and third vacuum chambers 24 and 50 with the vacuum pump 42 and admitting atmospheric air into these two chambers as represented in FIG. 4. Since now a vacuum exists only in the first vacuum chamber 22, the elastic diaphragm 20 is sucked toward the glass pane 18a to press the original 26 and the sensitive material 28 into close, uniform contact with each other, just as in the printing frame 14.

FIG. 5 shows the top cover 52 subsequently removed from the casing 16a. The sensitive material 28 may now be exposed through the original 26 and glass pane 18a. Thereafter atmospheric air may be introduced into the first vacuum chamber 22, and the glass pane 18a may be removed to take out the exposed material 28, with or without the original 26.

As is apparent from the foregoing, not only the elastic diaphragm 20 but also the glass pane 18a receives no atmospheric pressure during the evacuation of the first vacuum chamber 22 in this printing frame 14a, because the second and third vacuum chambers 24 and 50 are exhausted simultaneously with the first vacuum chamber 22. However, if the first vacuum chamber 22 has a different degree of vacuum from those of the second and third vacuum chambers 24 and 50, the pressure differentials will force the elastic diaphragm 20 and glass pane 18a toward the chamber or chambers of higher vacuum.

The three vacuum chambers 22, 24 and 50 should therefore be evacuated at approximately the same rate to reduce the pressure differentials acting on the glass pane 18a and elastic diaphragm 20. For the same reason the introduction of atmospheric air into the second and third vacuum chambers 24 and 50 should proceed at approximately the same rate. The glass pane 18a of ordinary strength, however, will withstand some pressure differential.

Thus, according to this printing frame 14a, the glass pane 18a need not be so thick as the glass pane 18 of the printing frame 14. Its thickness can be just about the same as that of the glass pane used in the prior art. Consequently the printing frame 14a makes it possible to establish uniform contact between original 26 and sensitive material 28 without impeding their exposure. Experiment has proved that, like the device of FIGS. 1 and 2, this printing frame 14a also requires from 30 to 60 seconds for simultaneously evacuating the three vacuum chambers 22, 24 and 50 to an extent necessary for obtaining proper contact between a 24-by-30-in. "lith" type film and a full-A-size PS plate.

It will also be appreciated that the casing 16a with its top cover 52 completely encloses the glass pane 18a and elastic diaphragm 20. Thus, not only is the elastic diaphragm 20 protected from damage due to external forces, as in the printing frame 14 of FIGS. 1 and 2, but also the glass pane 18a is guarded against damage and dust accumulation.

Figure 6:
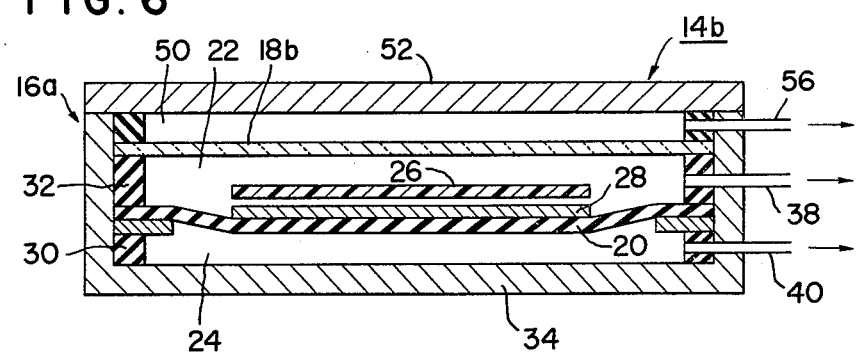
FIGS. 6, 7 and 8 are a series of vertical sectional views showing the sequential steps of operation of yet another preferred form of the vacuum printing frame according to the invention.
Figure 7:
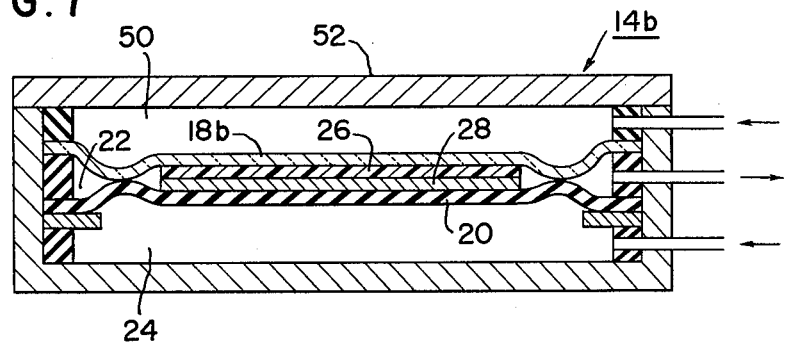
Figure 8:
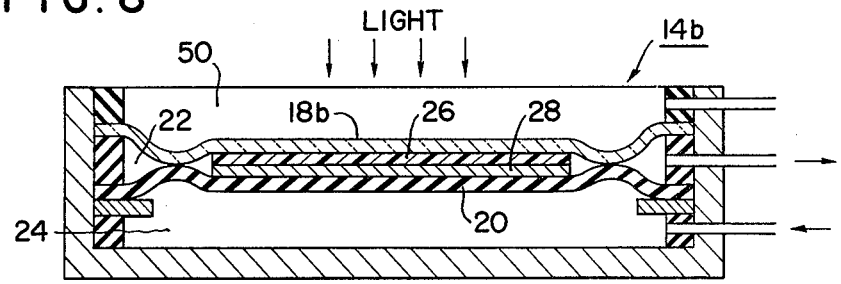

FIGS. 6, 7 and 8 show another modified vacuum printing frame 14b. This printing frame differs from the printing frame 14a only in that the former employs an elastic light-transmitting plate 18b, which usually takes the form of a transparent film. Since the other parts of the printing frame 14b correspond exactly to those of the printing frame 14a, such parts will be identified in the following description by the same reference characters as those used to denote the corresponding parts in FIGS. 3 to 5.

The manner of use of the printing frame 14b is also analogous to that of the printing frame 14a. Following the mounting of the original 26 and sensitive material 28 in the first vacuum chamber 22, the three vacuum chambers 22, 24 and 50 are evacuated simultaneously. Although the evacuation of the three vacuum chambers at the same rate is preferred, some differences are allowable because the light-transmitting plate 18b has elasticity.

Then, as shown in FIG. 7, only the second and third vacuum chambers 24 and 50 are allowed to return gradually to atmospheric pressure, at approximately the same rate. Since the light-transmitting plate 18b and diaphragm 20 are both elastic in this printing frame 14b, these members are urged toward each other by suction thereby conjointly pressing the original 26 and sensitive material 28 into close, uniform contact with each other.

FIG. 8 shows the top cover 52 subsequently removed from the casing 16a for printing the image of the original 26 on the sensitive material 28 by exposure through the light-transmitting plate 18b. Upon completion of the printing operation the first vacuum chamber 22 is caused to admit atmospheric air, for removal of the printed material 28 with or without the original 26.

The elastic light-transmitting plate 18b, such as that in the form of transparent film, possesses the advantages of being lighter in weight and thinner than glass or like rigid plates. Since this plate 18b has no possibility of rupturing because of the pressure differential acting thereon, it lends itself to use in large-sized printing frames such as those for prints of twice the full B size.

Used as the light-transmitting plate 18b, a transparent film will suffer scratches and other surface imperfections with the repetition of printing operations. The continued use of such damaged film is objectionable because it would adversely affect exposure. A covential roll-film transport mechanism may therefore be incorporated with the printing frame 14b, in order that successive lengths of such roll film may be put to use as the light-transmitting plate 18b.

Since the light-transmitting plate 18b is elastic in this printing frame 14b, it permits the use of metal, wood, or like rigid material for the diaphragm 20, which in this case may be more properly termed a support plate or partition. With the use of such a rigid support plate, however, the thickness or height of the first vacuum chamber (i.e., the spacing between the light-transmitting plate and support plate) should be in the range of 5 to 30 mm for the best results. Only the elastic light-transmitting plate will then deflect to press the materials against the rigid support plate on introduction of atmospheric air into the second and third vacuum chambers following the evacuation of all the three chambers.

Figure 9:
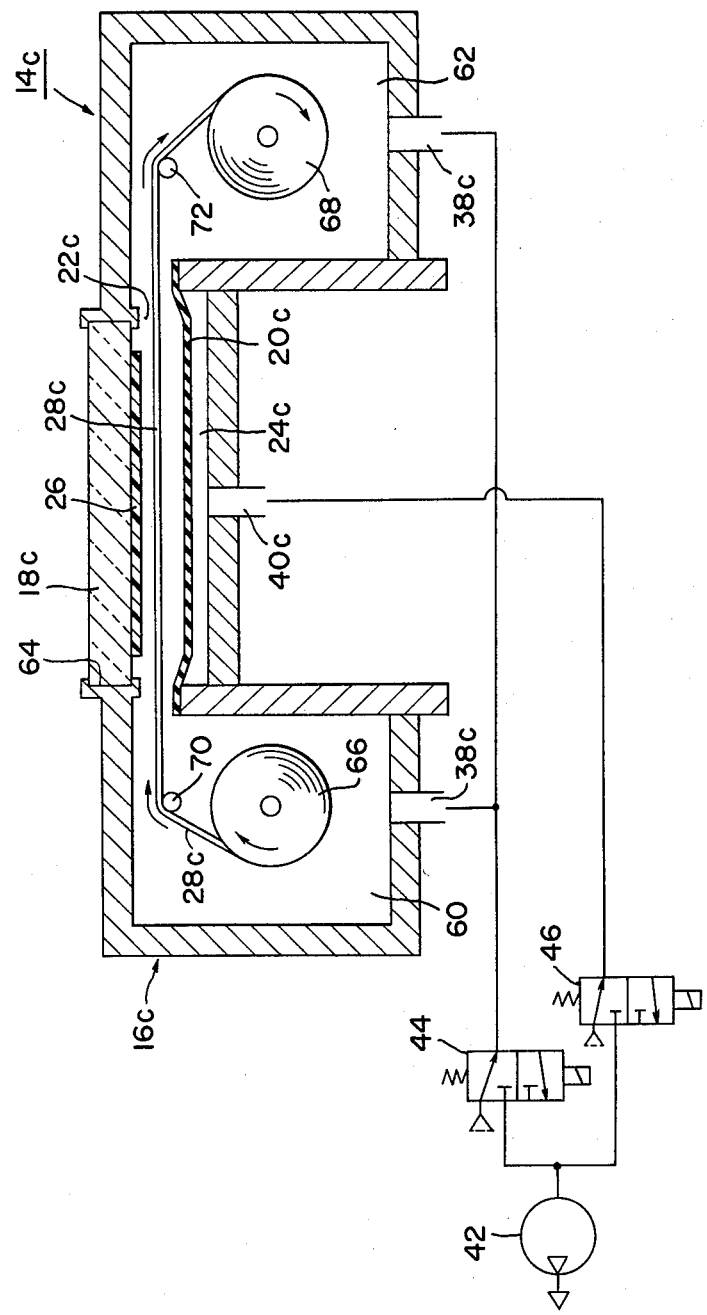
FIGS. 9 and 10 are also a series of vertical sectional views showing the sequential steps of operation of the continuous vacuum printing apparatus according to the invention.
Figure 10:
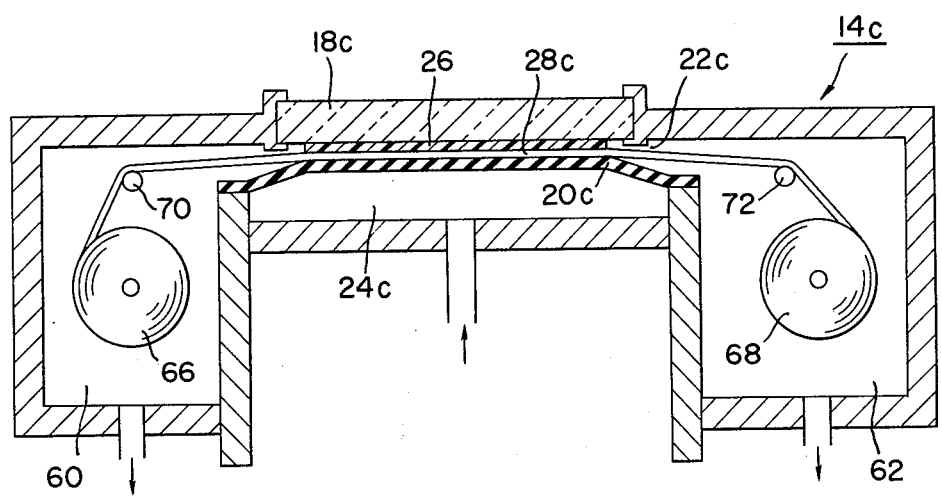

FIGS. 9 and 10 show an adaptation of the vacuum printing frame 14 of FIGS. 1 and 2 for use with a continuous strip of light-sensitive material 28c. Generally labeled 14c, the continuous printing apparatus includes a casing 16c of rigid make defining a hermetically sealed space therein. The sealed space comprises a first vacuum chamber 22c disposed centrally of the casing 16c, a second vacuum chamber 24c under the first vacuum chamber, and a payoff chamber 60 and takeup chamber 62 on the opposite sides of the first vacuum chamber and in open communication therewith. An elastic diaphragm 20c discommunicates the first vacuum chamber 22c, as well as the payoff and takeup chambers 60 and 62, from the second vacuum chamber 24c.

Just over the first vacuum chamber 22c a relatively thick pane of glass 18c is airtightly fitted in an opening 64 formed in the casing 16c. The original 26 is detachably attached to the underside of the glass pane 18c, as by means of adhesive tape (not shown).

A payoff reel 66 and takeup reel 68 are rotatably mounted in the payoff and takeup chambers 60 and 62 respectively. Unwound from the payoff reel 66, the continuous strip of sensitive material 28c extends over a first guide roll or pin 70, through the first vacuum chamber 22c, and over a second guide roll or pin 72, and is wound up on the takeup reel 68. The payoff 60 and takeup 62 chambers have suction ports 38c communicating with the vacuum pump 42 via the valve 44 for evacuating the first vacuum chamber 22c. The second vacuum chamber 24c also has a suction port 40c in communication with the vacuum pump 42 via the valve 46.

In the use of the continuous printing apparatus 14c the original 26 may first be attached to the underside of the glass pane 18c as by adhesive tape. The payoff reel 66, complete with the continuous strip of sensitive material 28c coiled thereon, and the takeup reel 68 are mounted in the payoff and takeup chambers 60 and 62 respectively. Then the sensitive strip 28c is unwound from the payoff reel 66, threaded over the guide rolls 70 and 72, and anchored to the takeup reel 60. The sensitive strip 28c is held tautly between the rolls 66 and 68 and must have its light-sensitive surface oriented opposite to the original 26 on the underside of the glass gane 18c.

Then the first and second vacuum chambers 22c and 24c are evacuated simultaneously by placing these chambers in communication with the vacuum pump 42 via the valves 44 and 46. The first vacuum chamber 22c communicates with the vacuum pump through the payoff and takeup chambers 60 and 62, whereas the second vacuum chamber 24c makes direct communication therewith. As in the preceding embodiments the evacuation of the first and second vacuum chambers 22c and 24c should proceed at approximately the same rate to prevent any undue deflection of the diaphragm 20c due to pressure differential. The printing apparatus 14c will remain in the state of FIG. 9 during such simultaneous evacuation of the two vacuum chambers.

Then, with the first vacuum chamber 22c held in vacuum, the second vacuum chamber 24c is caused to admit atmospheric air by actuating the valve 46. The diaphragm 20c responds to the atmospheric pressure in the second vacuum chamber 24c to press the desired portion of the sensitive strip 28c into close, uniform contact with the original 26, as shown in FIG. 10. The original image is then printed on the sensitive strip 28c by exposure through the glass pane 18c.

The atmospheric air is introduced into the first vacuum chamber 22c via the payoff and takeup chambers 60 and 62. Thereupon the diaphragm 20c returns to the normal position of FIG. 9 and so releases the sensitive strip 28c. Then the takeup reel 68 is revolved by a suitable drive mechanism, not shown, to wind up a desired length of the sensitive strip 28c from the pay-off reel 66 and hence to feed the fresh length of the sensitive strip into the first vacuum chamber 22c. One cycle of printing operation is now completed. The repetition of this cycle makes it possible to continuously print the original image on successive lengths of the sensitive strip 28c.

One of the advantages of this continuous printing apparatus 14c is that it requires no packing between glass pane 18c and diaphragm 20c. This advantage arises from the constant communication of the first vacuum chamber 22c with the payoff and takeup chambers 60 and 62. The sensitive strip 28c can therefore be fed smoothly through the first vacuum chamber, without the possibility of being damaged by such a packing. Not having such a packing, moreover, the apparatus permits the use of a sensitive strip of any desired thickness.

In the above described procedure of continuous printing operation the first vacuum chamber 22c is returned to atmospheric pressure for causing the diaphragm 20c to release the sensitive strip 28c after the printing of the original image on each unit length of the sensitive strip. Being in open communication with the chambers 60 and 62, however, the first vacuum chamber 22c demands a substantial length of time to attain a degree of vacuum from atmospheric pressure. The foregoing procedure allows reduction of this evacuation time only by use of a larger pump. The following is a discussion of an alternative continuous printing method, which overcomes the noted weakness of the previous method.

This second method differs from the first only after the completion of each printing operation. Upon exposure of each unit length of the sensitive strip 28c atmospheric air is fed into the first vacuum chamber 22c only to such an extent that the vacuum in this chamber drops to the range of, for example, 600 to 700 mmHg. Simultaneously the second vacuum chamber 24c, which has been at atmospheric pressure, is evacuated to the maximum possible degree of vacuum. The vacuum in the second vacuum chamber 24c becomes higher than that in the first vacuum chamber 22c when the evacuation of the second chamber proceeds past the noted range of 600 to 700 mmHg vacuum. This pressure differential causes the diaphragm 20c to return from its FIG. 10 position to that shown in FIG. 9.

The sensitive strip 28c is then fed a desired distance from payoff reel 66 to takeup reel 68. Concurrently the first vacuum chamber 22c is exhausted to the maximum possible degree. Since the first vacuum chamber has already been in a certain degree of vacuum, it will reach the desired maximum vacuum in a comparatively short time. The time for the second vacuum chamber 24c to attain the maximum vacuum from atmospheric pressure will be equally short by virtue of its capacity much less than the combined capacity of the first vacuum chamber 22c and payoff and takeup chambers 60 and 62.

Atmospheric air is introduced into the second vacuum chamber 24c after the first and second vacuum chambers have both reached the desired degree of vacuum. Thereupon the diaphragm 20c will press the sensitive strip 28c into contact with the original 26 on the underside of the glass pane 18c. The apparatus 14c is now ready for exposure. By the repetition of this cycle the original image can be efficiently printed on successive lengths of the sensitive strip 28c.

Although the first vacuum chamber 22c has varying degrees of vacuum during each printing cycle in the above alternative procedure, it is also possible to maintain the first vacuum chamber at some fixed degree of vacuum between, for example, 600 and 700 mmHg. The diaphragm 20c will nevertheless deflect toward and away from the glass pane 18c if the vacuum in the second vacuum chamber 24c is made higher and lower than the fixed degree of vacuum in the first chamber.

The pressure required for the establishment of proper contact between original 26 and sensitive strip 28c depends upon the elasticity of the sensitive material in use. A vacuum of 450 to 500 mmHg suffices for film having a thickness of 0.3 mm or less, and a vacuum of more than 700 mmHg for thicker, less pliant materials such as plastic, aluminum, and PS plates. The degree of vacuum need not be made close to 760 mmHg for such comparatively elastic or pliant materials. Sensitized glass or like rigid materials do demand a vacuum close to 760 mmHg, but such rigid materials do not find use with this continuous printing apparatus 14c.

It will be seen that this apparatus is adaptable for use with foldable strips of light-sensitive materials, instead of the illustrated rollable strip. The foldable strip may be held folded in a chamber equivalent to the payoff chamber and fed, frame by frame, into and past the first vacuum chamber by a known feed mechanism for such foldable materials.

The continuous printing apparatus 14c is open to a variety of additional applications. Included in such possible applications are the preparation of flexible printing plates, the production of duplicates with the use of silver salt film, and screen printing on rolled gravure tissue. Further, for photoresist printing on small, rigid, sensitized materials such as nesa glass and ceramic plates, they may be employed a roll of flexible carrier strip having a series of depressions for closely receiving such materials. Still further the apparatus is applicable to the production of a number of identical prints on a continuous PS strip as for newspaper printing and to the printing on sheet metal by the etching process.

Figure 11:
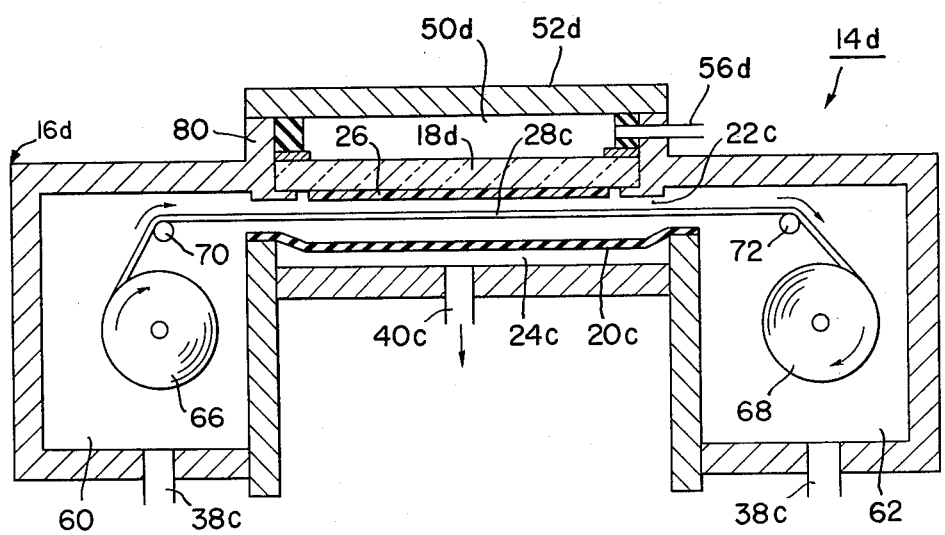
FIG. 11 is a vertical sectional view of another preferred form of the continuous vacuum printing apparatus according to the invention, the view corresponding to FIG. 9.

FIG. 11 is an illustration of another continuous printing apparatus 14d which, in essence, is an adaptation of the vacuum printing frame 14a of FIGS. 3 to 5 for continuous printing operation. This apparatus 14d features a third vacuum chamber 50d defined just over a glass pane 18d by a part 80 of a casing 16d and a removable top 52d. The third vacuum chamber 50d has its own suction port 56d. As has been explained in connection with FIGS. 3 to 5, the third vacuum chamber 50d makes possible the use of the glass pane 18d of reduced thickness. The other details of construction and operation of this printing apparatus 14d are believed self-evident from the foregoing description of the printing frame 14a of FIGS. 3 to 5 and of the continuous printing apparatus 14d of FIGS. 9 and 10.

What is claimed is:

1. In a contact printing method wherein an original and a light-sensitive material are placed in superposition in a vacuum chamber formed between a light-transmitting plate and an elastic diaphragm, with the original being disposed closer to the light-transmitting plate, the improvement which comprises:
   (a) providing a second vacuum chamber disposed opposite to the first recited vacuum chamber across the diaphragm,
   (b) evacuating the first and the second vacuum chambers similtaneously;
   (c) causing the light-transmitting plate and the diaphragm to press the original and the light-sensitive material into close, uniform contact with each other by introducing atmospheric pressure into the second vacuum chamber; and
   (d) exposing the light-sensitive material to light through the light-transmitting plate and the original.

2. In a contact printing method wherein an original and a light-sensitive material are placed in superposition in a vacuum chamber, the improvement which comprises:
   (a) defining the vacuum chamber between a light-transmitting plate and a diaphragm, at least the diaphragm being elastic, the original and light-sensitive material being placed in the vacuum chamber with the original disposed closer to the light-transmitting plate;
   (b) providing a second vacuum chamber disposed opposite to the first recited vacuum chamber across the diaphragm;
   (c) providing a third vacuum chamber disposed opposite to the first vacuum chamber across the light-transmitting plate;
   (d) evacuating the first, the second and the third vacuum chambers simultaneously;
   (e) causing the light-transmitting plate and the diaphragm to press the original and the light-sensitive material into close, uniform contact with each other by introducing atmospheric pressure into the second and the third vacuum chambers; and
   (f) exposing the light-sensitive material to light through the light-transmitting plate and the original.

3. In a continuous contact-printing method wherein a vacuum chamber is formed between a light-transmitting plate and an elastic diaphragm, and wherein an original is attached to the inside surface of the light-transmitting plate, the improvement which comprises:
   (a) providing a second vacuum chamber disposed opposite to the first recited vacuum chamber across the diaphragm;
   (b) stretching a continuous strip of light-sensitive material through the first vacuum chamber;
   (c) evacuating the first and the second vacuum chambers simultaneously;
   (d) causing the diaphragm to press the light-sensitive material into close, uniform contact with the original on the inside surface of the light-transmitting plate by introducing atmospheric pressure into the second vacuum chamber;
   (e) exposing the light-sensitive material to light through the light-transmitting plate and the original;
   (f) causing the diaphragm to release the light-sensitive material by introducing atmospheric pressure into the first vacuum chamber;
   (g) feeding a fresh length of the light-sensitive material into the first vacuum chamber; and
   (h) repeating the cycle of steps (c) to (g).

4. A continuous contact-printing method according to claim 3, wherein the diaphragm is caused to release the light-sensitive material by introducing atmospheric pressure into the first vacuum chamber only to such an extent that the latter remains in a prescribed degree of vacuum and by simultaneously evacuating the second vacuum chamber to an extent greater than the prescribed degree of vacuum in the first vacuum chamber.

5. In a contact printing apparatus of the type having a vacuum chamber formed between a light-transmitting plate and an elastic diaphragm for accomodating an original and a light-sensitive material in superposition, the improvement comprising:
   (a) means for defining a second vacuum chamber disposed opposite to the first recited vacuum chamber across the diaphragm;
   (b) means for evacuating the first and second vacuum chambers simultaneously; and
   (c) means for introducing thereafter atmospheric pressure into the second vacuum chamber, whereby the original and light-sensitive material in the first vacuum chamber can be urged into close, uniform contact with each other by first simultaneously evacuating the first and second vacuum chambers and then by introducing atmospheric pressure into the second vacuum chamber.

6. A contact printing apparatus according to claim 5, further comprising means for defining a third vacuum chamber disposed opposite to the first vacuum chamber across the light-transmitting plate, the third vacuum chamber being evacuated simultaneously with the first and the second vacuum chambers by the evacuating means in order to reduce the pressure differential acting on the light-transmitting plate.

7. A contact printing apparatus according to claim 6, wherein the light-transmitting plate is elastic.

8. In a continuous contact-printing apparatus of the type having a vacuum chamber formed between a light transmitting plate and an elastic diaphragm, with an original attached to the inside surface of the light transmitting plate, the improvement comprising:
   (a) means for defining a second vacuum chamber opposed to the first recited vacuum chamber across the diaphragm;
   (b) means for defining a hermetically sealed payoff chamber and takeup chamber on the opposite sides of and in constant communication with the first vacuum chamber;
   (c) means for feeding a continuous strip of light-sensitive material from the payoff chamber to the takeup chamber through the first vacuum chamber; and
   (d) means for evacuating the first and the second vacuum chambers.

9. A continuous contact-printing apparatus according to claim 8, further comprising means for defining a third vacuum chamber opposed to the first vacuum chamber across the light-transmitting plate, the third vacuum chamber being also evacuated by the evacuating means.

* * * * *